(12) United States Patent
Chiang et al.

(10) Patent No.: US 11,282,705 B2
(45) Date of Patent: Mar. 22, 2022

(54) SEMICONDUCTOR DEVICE AND METHOD OF FORMING THE SAME (71) Applicant: Taiwan Semiconductor Manufacturing Co., Ltd., Hsinchu (TW)

(72) Inventors: Hsin-Che Chiang, Taipei (TW); Chun-Sheng Liang, Changhua County (TW); Kuo-Hua Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/916,116

(22) Filed: Jun. 30, 2020

(65) Prior Publication Data

US 2020/0335337 A1 Oct. 22, 2020

Related U.S. Application Data

(63) Continuation of application No. 16/164,779, filed on Oct. 18, 2018, now Pat. No. 10,714,342.

(60) Provisional application No. 62/712,217, filed on Jul. 31, 2018.

(51) Int. Cl.
*H01L 21/033* (2006.01)
*H01L 29/423* (2006.01)
*H01L 21/311* (2006.01)
*H01L 21/764* (2006.01)
*H01L 29/66* (2006.01)
*H01L 29/78* (2006.01)

(52) U.S. Cl.
CPC ...... *H01L 21/0332* (2013.01); *H01L 21/0337* (2013.01); *H01L 21/31144* (2013.01); *H01L 21/764* (2013.01); *H01L 29/4232* (2013.01); *H01L 29/6653* (2013.01); *H01L 29/66795* (2013.01); *H01L 29/785* (2013.01)

(58) Field of Classification Search
CPC ............ H01L 21/0332; H01L 21/0337; H01L 21/31144; H01L 21/764; H01L 29/4232; H01L 29/6653; H01L 29/785; H01L 29/66795; H01L 29/66553; H01L 29/4958; H01L 29/6656
See application file for complete search history.

(56) References Cited

U.S. PATENT DOCUMENTS

| | | | | |
|---|---|---|---|---|
| 8,772,109 B2* | 7/2014 | Colinge | ............ | H01L 21/02667 438/269 |
| 8,785,285 B2* | 7/2014 | Tsai | ........................ | H01L 29/45 438/300 |
| 8,816,444 B2* | 8/2014 | Wann | ................... | H01L 27/0207 257/401 |
| 8,823,065 B2* | 9/2014 | Wang | ................ | H01L 21/02178 257/288 |
| 8,860,148 B2* | 10/2014 | Hu | ...................... | H01L 27/0629 257/401 |

(Continued)

*Primary Examiner* — Earl N Taylor
(74) *Attorney, Agent, or Firm* — JCIPRNET (57) ABSTRACT

A semiconductor device includes a gate electrode, spacers and a hard mask structure. The spacers are disposed on opposite sidewalls of the gate electrode. The hard mask structure includes a first hard mask layer and a second hard mask layer. A lower portion of the first hard mask layer is disposed between the spacers and on the gate electrode, and a top portion of the first hard mask layer is surrounded by the second hard mask layer.

20 Claims, 8 Drawing Sheets

(56) References Cited

U.S. PATENT DOCUMENTS

| | | | |
|---|---|---|---|
| 9,105,490 B2* | 8/2015 | Wang | H01L 29/66795 |
| 9,209,273 B1* | 12/2015 | Lin | H01L 29/4966 |
| 9,236,267 B2* | 1/2016 | De | H01L 21/3088 |
| 9,236,300 B2* | 1/2016 | Liaw | H01L 21/76895 |
| 9,466,564 B1* | 10/2016 | Liou | H01L 21/76895 |
| 9,520,482 B1* | 12/2016 | Chang | H01L 21/823437 |
| 9,576,814 B2* | 2/2017 | Wu | H01L 21/3086 |
| 9,607,892 B2* | 3/2017 | Liou | H01L 21/76895 |
| 10,211,092 B1* | 2/2019 | Cheng | H01L 29/66795 |
| 10,388,770 B1* | 8/2019 | Xie | H01L 29/785 |
| 10,700,180 B2* | 6/2020 | Chen | H01L 29/66795 |
| 10,714,342 B2* | 7/2020 | Chiang | H01L 29/785 |
| 2009/0042351 A1* | 2/2009 | Bo | H01L 29/6653 438/305 |
| 2013/0320411 A1* | 12/2013 | Fan | H01L 29/78 257/288 |
| 2015/0091089 A1* | 4/2015 | Niebojewski | H01L 29/66575 257/347 |
| 2015/0187896 A1* | 7/2015 | Kamineni | H01L 29/41791 257/288 |
| 2016/0079354 A1* | 3/2016 | Park | H01L 29/66545 257/386 |
| 2016/0240382 A1* | 8/2016 | Yang | H01L 21/823842 |
| 2016/0284641 A1* | 9/2016 | Liou | H01L 21/76897 |
| 2016/0315007 A1* | 10/2016 | Liou | H01L 29/00 |
| 2016/0336426 A1* | 11/2016 | Chang | H01L 29/6656 |
| 2018/0097059 A1* | 4/2018 | Bi | H01L 23/5283 |
| 2018/0138279 A1* | 5/2018 | Xie | H01L 29/4991 |
| 2018/0166319 A1* | 6/2018 | Park | H01L 29/6653 |
| 2018/0175171 A1* | 6/2018 | Lo | H01L 21/7685 |
| 2018/0277430 A1* | 9/2018 | Xie | H01L 21/764 |
| 2019/0229199 A1* | 7/2019 | Tsai | H01L 29/66545 |
| 2019/0312123 A1* | 10/2019 | Cheng | H01L 29/4966 |
| 2019/0378909 A1* | 12/2019 | Cheng | H01L 21/7682 |
| 2020/0035804 A1* | 1/2020 | Chen | H01L 29/66545 |
| 2020/0043732 A1* | 2/2020 | Chiang | H01L 29/785 |
| 2020/0044074 A1* | 2/2020 | Liang | H01L 29/66795 |
| 2020/0335337 A1* | 10/2020 | Chiang | H01L 29/4232 |
| 2021/0167059 A1* | 6/2021 | Lee | H01L 27/0886 |

* cited by examiner

SEMICONDUCTOR DEVICE AND METHOD OF FORMING THE SAME

CROSS-REFERENCE TO RELATED APPLICATION

This application is a continuation application of and claims the priority benefit of a prior application Ser. No. 16/164,779, filed on Oct. 18, 2018, and claims the priority benefit of U.S. provisional application Ser. No. 62/712,217, filed on Jul. 31, 2018. The entirety of each of the above-mentioned patent applications is hereby incorporated by reference herein and made a part of this specification.

BACKGROUND

The semiconductor integrated circuit (IC) industry has experienced exponential growth. Technological advances in IC design and materials have produced generations of ICs where the generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, scaling down has also increased the risk of bridging or electrical shorting problems, which would degrade semiconductor device performance or even cause device failures. Although existing semiconductor fabrication methods have been generally adequate for their intended purposes, they have not been entirely satisfactory in all respects.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of a three-dimensional structure with height differences and the structure(s) fabricated there-from. Certain embodiments of the present disclosure describe the exemplary manufacturing process of one or more FinFETs and the FinFETs fabricated there-from, where the FinFETs may also referred to as a semiconductor device herein. The FinFET may be formed on bulk silicon substrates in certain embodiments of the present disclosure. Still, the FinFET may be formed on a silicon-on-insulator (SOI) substrate as alternatives. Also, in accordance with some embodiments, the silicon substrate may include other conductive layers or other semiconductor elements, such as transistors, diodes or the like. The embodiments are not limited in this context.

FIGS. 1A to 1K are cross-sectional views at various stages of forming a semiconductor device 10 in accordance with some embodiments of the present disclosure. In some embodiments, the semiconductor device 10 is a field effect transistor such as a fin field effect transistor (FinFET). The FinFET refers to any fin-based, multi-gate transistor. In alternative some embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC). In some embodiments, the semiconductor device 10 is a long channel field effect transistor. In alternative some embodiments, the semiconductor device 10 is a short channel field effect transistor.

In addition, the semiconductor device 10 of FIGS. 1A to 1K may be further processed using CMOS technology processing. Accordingly, it is understood that additional processes may be provided before, during, and after the method for forming the semiconductor device of FIGS. 1A to 1K, and that some other processes may only be briefly described herein. Also, FIGS. 1A to 1K are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

Figure 1A:
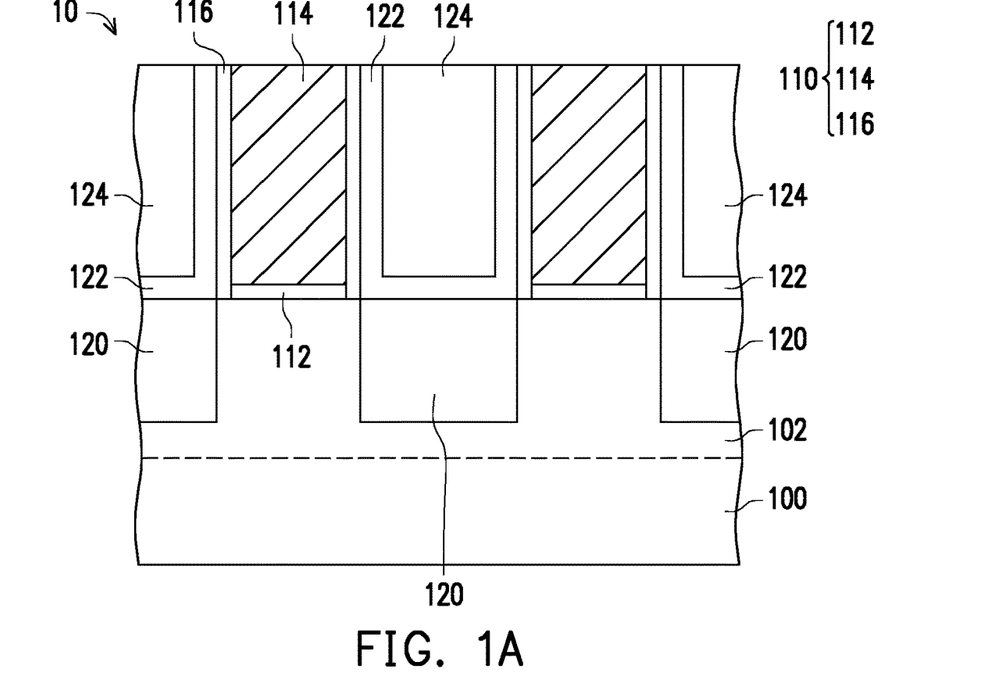
FIGS. 1A to 1K are cross-sectional views at various stages of forming a semiconductor device in accordance with some embodiments of the present disclosure.

Referring to FIG. 1A, a substrate 100 is provided. In some embodiments, the substrate 100 includes a crystalline silicon substrate (e.g., wafer). The substrate 100 may include various doped regions depending on design requirements (e.g., p-type substrate or n-type substrate). In some embodiments, the doped regions may be doped with p-type and/or n-type dopants. For example, the doped regions may be doped with p-type dopants such as boron or $BF_2$, n-type dopants such as phosphorus or arsenic and/or combinations thereof. The doped regions may be configured for an n-type FinFET, a p-type FinFET or the combination thereof. In alternative some embodiments, the substrate 100 may be made of some other suitable elemental semiconductor such as diamond or germanium, a suitable compound semiconductor such as gallium arsenide, silicon carbide, indium arsenide or indium phosphide, or a suitable alloy semiconductor such as silicon germanium carbide, gallium arsenic phosphide or gallium indium phosphide.

As shown in FIG. 1A, at least one fin structure 102 is formed on and/or in the substrate 100. In some embodiments, portions of the substrate 100 are removed to define the fin structure 102 protruding from the substrate 100. In some embodiments, the substrate 100 and the fin structure 102 are integrally formed, that is, there is no boundary between the substrate 100 and the fin structure 102. However, other techniques for fabricating the fin structure 102 are possible. In some embodiments, the substrate 100 and the fin structure 102 are made of the same material.

In some embodiments, an isolation structure (not shown) is formed between the fin structures 102, such as a local oxidation of silicon (LOCOS) or a shallow trench isolation (STI) structure. The isolation structure is configured to isolate the two fin structures 102. The isolation structure may be formed by filling a trench between the fin structures 102 with a dielectric material. In some embodiments, the dielectric material may include $SiO_2$, SiN, SiON, fluoride-doped silicate glass (FSG), a spin-on dielectric material, any other suitable dielectric material or a combination thereof. The dielectric material may be formed by high-density-plasma chemical vapor deposition (HDP-CVD), sub-atmospheric CVD (SACVD) or by spin-on. In some embodiments, the isolation structure may have a multi-layer structure such as a thermal oxide liner layer filled with SiN or $SiO_2$.

In some embodiments, the fin structure 102 is an active region. In some alternative embodiments, the active regions may be formed in the substrate 100 and include various doping configurations depending on design requirements as known in the art. In some alternative embodiments, the active region may be doped with p-type or n-type dopants. For example, the active regions may be doped with p-type dopants such as boron or $BF_2$, n-type dopants such as phosphorus or arsenic and/or combinations thereof. The active regions may be configured for an N-type metal-oxide-semiconductor field effect transistor (referred to as an NMOSFET), or alternatively configured for a P-type metal-oxide-semiconductor field effect transistor (referred to as a PMOSFET).

A plurality of gate structures 110 are disposed on the fin structure 102 and cross over the fin structure 102, as shown in FIG. 1A. The gate structure 110 includes a gate dielectric layer 112, a gate electrode 114 and a spacer 116, for example. The gate dielectric layer 112 is disposed between the fin structure 102 and the gate electrode 114, and the spacer 116 is in contact with the gate electrode 114, but the disclosure is not limited thereto. In some alternative embodiments, the gate dielectric layer 112 is further disposed on a sidewall of the gate electrode 114 and between the gate electrode 114 and the spacer 116. The cross section in FIG. 1A shows the gate structure 110 being located above the fin structure 102. However, in another cross section taken along another direction, the gate structure 110 continuously covers on sidewalls and top surfaces of the fin structures 102. In some embodiments, a height of the gate structure 110 ranges from 65 nm to 85 nm.

In some embodiments, the material of the gate dielectric layer 112 includes $SiO_2$, SiN, high k dielectrics such as metal oxides, or a combination thereof. Examples of the metal oxides include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, the method of forming the gate dielectric layer 112 may include a deposition process. The deposition process may include atomic layer deposition (ALD), molecular beam deposition (MBD), chemical vapor deposition (CVD), physical vapor deposition (PVD), flowable chemical vapor deposition (FCVD), thermal oxidation, UV-ozone oxidation, or a combination thereof. In some embodiments, the gate structure 110 may further include an interfacial layer (not shown) to minimize stress between the gate dielectric layer 112 and the fin structure 102. The interfacial layer may be formed of $SiO_2$ or SiON grown by a thermal oxidation process. For example, the interfacial layer can be grown by a rapid thermal oxidation (RTO) process or in an annealing process including oxygen.

In some embodiments, the gate electrode 114 is single-layer structure. In some alternative embodiments, the gate electrode 114 is multi-layer structure. In some embodiments, the material of the gate electrode 114 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the method of forming the gate electrode 114 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. Moreover, the gate electrode 114 may further include a barrier layer, a work function layer, a liner layer, an interface layer, a seed layer, an adhesion layer, etc. In some embodiments, the gate electrode 114 is also referred as a metal gate (MG), for example.

In some embodiments, in the gate structure 110, the spacer 116 is disposed adjacent to the two sides of the gate electrode 114. In some embodiments, the spacer 116 is single-layer. In some alternative embodiments, the spacer 116 may be multiple-layer structure. In some embodiments, the material of the spacer 116 includes $SiO_2$, SiN, SiON, SiCN, SiOCN or other suitable material. In some embodiments, the material of the spacer 116 may be SiOCN. In some embodiments, the spacer 116 has a thickness in the range of about 1 nm to about 5 nm, such as about 2 nm to about 3 nm. In some embodiments, the method of forming the spacer 116 may include a deposition process and then an etching process. The deposition process may include atomic layer deposition (ALD), molecular beam deposition (MBD), chemical vapor deposition (CVD), physical vapor deposition (PVD), flowable chemical vapor deposition (FCVD), or a combination thereof. The etching process may include an anisotropic etching process or other suitable process.

A source-drain region 120 is disposed in the fin structure 102 and/or the substrate 100 aside the gate structure 110. In some embodiments, the source-drain region 120 is disposed adjacent to the two sides of the spacer 116. In some embodiments, portions of the fin structure 102 are removed to form recesses using photolithography and etching processes, and then, the source-drain region 120 is formed by being implanted after being epitaxially (epi) grown in the recesses. The source-drain region 120 is located within the recess and has a top surface which is substantially flush with or coplanar with a top surface of the fin structure 102. However, the disclosure is not limited thereto; in some alternative embodiments, the source-drain region 120 protrudes from the recess and has the top surface higher than the top surface of the fin structure 102. In some embodiments, the source-drain region 120, such as silicon germanium (SiGe), is epitaxial-grown by a LPCVD process to form the source and drain of the p-type FinFET (or the PMOSFET). In alternative some embodiments, the source-drain region 120, such as silicon carbon (SiC), is epitaxial-grown by a LPCVD process to form the source and drain of the n-type FinFET (or the NMOSFET). In addition, although the source-drain region 120 is shaped as a rectangle, the disclosure is not limited thereto. In some alternative embodiment, the source-drain region 120 may be shaped as a diamond or other suitable shape. In some embodiments, the source-drain region 120 is optionally formed with silicide top layer (not shown) by silicidation.

A contact etch stop layer (CESL) 122 is disposed aside the gate structure 110. In some embodiments, the CESL 122 is disposed on sidewalls of the gate structure 110 and extended onto the source-drain region 120. The CESL 122 protects the gate structure 110 from being damaged during contact etching. In some embodiments, the CESL 122 is in contact with the spacer 116. In other words, the spacer 116 is disposed between the corresponding gate electrode 114 and the CESL 122. In some embodiments, the CESL 122 has a top surface substantially flush with or coplanar with a top surface of the gate structure 110. That is, the CESL 122 has the top surface substantially flush with or coplanar with top surfaces of the gate electrode 114 and the spacer 116. In some embodiments, the material of the CESL 122 includes SiN, SiCN, SiCON or a combination thereof. In some embodiments, the material of the CESL 122 may be SiN. In some embodiments, the CESL 122 has a thickness in the range of about 1 nm to about 3 nm. In some embodiments, the method of forming the CESL 122 may include a deposition process and then a planarization process. The deposition process may include atomic layer deposition (ALD), molecular beam deposition (MBD), chemical vapor deposition (CVD), physical vapor deposition (PVD), or a combination thereof. The planarization process may include a chemical mechanical polishing (CMP) process, an etch process, or other suitable process.

An inter-layer dielectric 124 is disposed between the gate structures 110 over the CESL 122. In some embodiments, the material of the inter-layer dielectric 124 is different from the material of the CESL 122. In some embodiments, the inter-layer dielectric 124 has a different etch selectivity from the spacer 116 and the CESL 122. In some embodiments, the material of the inter-layer dielectric 124 includes $SiO_2$, SiN, SiON, SiCN or other suitable material. In some embodiments, the material of the inter-layer dielectric 124 may be $SiO_2$ or FCVD oxide. In some embodiments, the inter-layer dielectric 124 has a top surface substantially flush with or coplanar with the top surfaces of the gate structure 110 and the CESL 122. That is, the inter-layer dielectric 124 has the top surface substantially flush with or coplanar with the op surfaces of the gate electrode 114, the spacer 116 and the CESL 122. In some embodiments, the method of forming the inter-layer dielectric 124 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. In some embodiments, the inter-layer dielectric 124 is single-layer structure. In some alternative embodiments, the inter-layer dielectric 124 is multi-layer structure. In some alternative embodiments, the inter-layer dielectric 124 may be multi-layer structure and have a hard mask layer as an uppermost layer, for example.

Figure 1B:
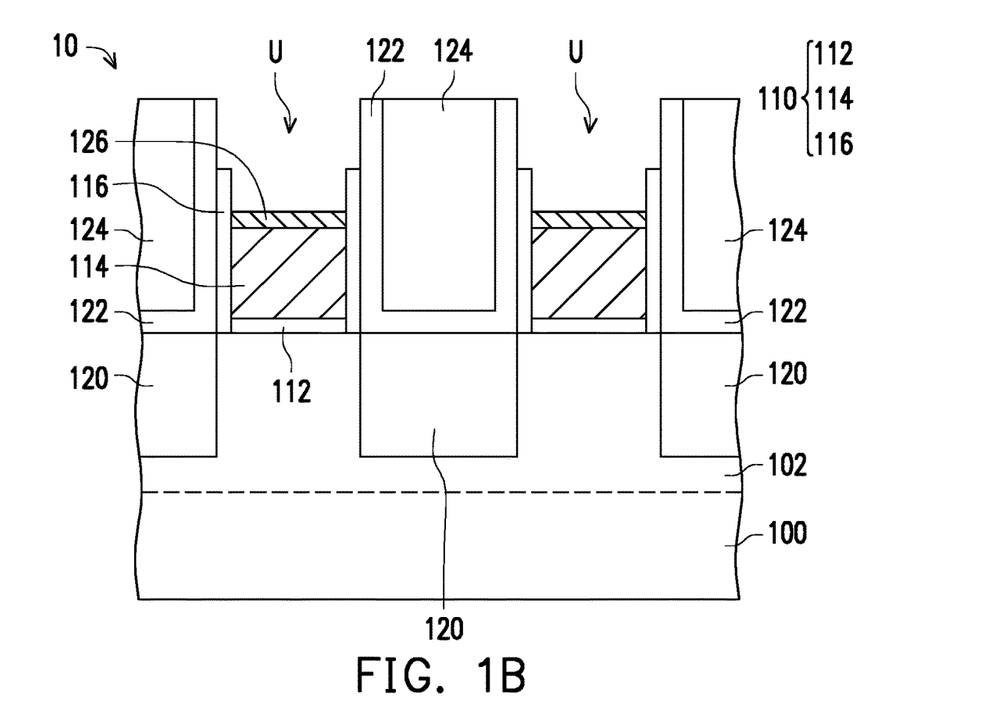

Referring to FIG. 1B, portions of the gate electrode 114 and the spacer 116 are removed, so as to form a recess U exposing portions of the CESL 122. In some embodiments, after the removal process, the top surface of the gate structure 110 is lower than the top surfaces of the CESL 122 and the inter-layer dielectric 124, in other words, the top surfaces of the gate electrode 114 and the spacer 116 are lower than the top surfaces of the CESL 122 and the inter-layer dielectric 124. In some embodiments, the top surface of the spacer 116 is not substantially flush with or coplanar with the top surface of the gate electrode 114. For example, the top surface of the spacer 116 is higher than the top surface of the gate electrode 114 and lower than the top surface of the CESL 122. In other words, in some embodiments, the recess U has a stepped sidewall, for example. However, the disclosure is not limited thereto; in some alternative embodiments, after the removal process, the top surface of the spacer 116 may be substantially flush with or coplanar with the top surface of the gate electrode 114. Accordingly, the recess U may have a straight sidewall, for example. In some alternative embodiments, when the gate dielectric layer 112 is further disposed between the spacer 116 and the gate electrode 114, the gate dielectric layer 112 is partially removed to have a top surface substantially flush with or coplanar with the top surface of the gate electrode 114.

In some embodiments, the gate electrode 114 and the spacer 116 may be removed by an etching process simultaneously or separately. In some embodiments, the top portion of the gate electrode 114 is removed by an etch back process, for example. In some embodiments, during the removal process, the CESL 122 and the inter-layer dielectric 124 are not removed with respect to the removals of the gate electrode 114 and the spacer 116 due to the specific etching selectivity chosen based on the material differences. In other words, the CESL 122 does not undergo a pull-back etching.

After the portions of the gate electrode 114 and the spacer 116 are removed, a conductive layer 126 is formed in a portion of the recess U to cover the gate electrode 114. In some embodiments, the conductive layer 126 has a top surface lower than the top surface of the spacer 116. However, the disclosure is not limited thereto; in some alternative embodiments, the conductive layer 126 may have the top surface substantially flush with or coplanar with the top surface of the spacer 116. In some embodiments, the material of the conductive layer 126 includes aluminum (Al), tungsten (W), copper (Cu), combinations thereof or any other suitable conductive material. In some embodiments, the material of the conductive layer 126 includes fluorine-free tungsten, for example. In some alternative embodiments, the conductive layer 126 is optional, that is, the conductive layer 126 may be omitted.

Figure 1C:
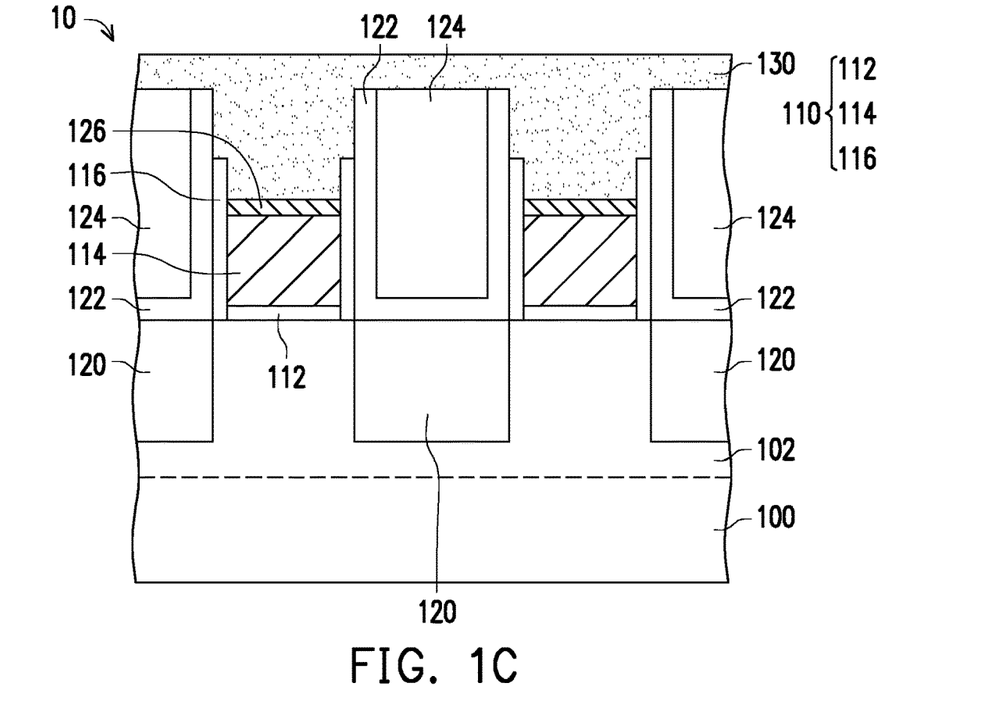

Referring to FIG. 1C, then, a material layer 130 is formed over the substrate 100 to fill up the recess U and cover the inter-layer dielectric 124. In some embodiments, the material of the material layer 130 is different from the materials of the spacer 116, the CESL 122 and the inter-layer dielectric 124. In some embodiments, the material of the material layer 130 has a different etch selectivity from the materials of the spacer 116, the CESL 122 and the inter-layer dielectric 124. In some embodiments, the etch selectivity between the materials of the material layer 130 and the CESL 122 is larger than 20, for example. In some embodiments, the material of the material layer 130 includes silicon such as amorphous silicon or other suitable material. In some embodiments, the material of the material layer 130 may be amorphous silicon. In some embodiments, the material layer 130 is formed by using a suitable process such as atomic layer deposition (ALD), molecular beam deposition (MBD), chemical vapor deposition (CVD), physical vapor deposition (PVD), or a combination thereof. In some alternative embodiments, before forming the material layer 130, a dielectric layer may be conformally formed on the conductive layer 126, the spacer 116, the CESL 122 and the inter-layer dielectric 124, and the material of the dielectric layer has a different etch selectivity from the materials of the spacer 116, the CESL 122 and the inter-layer dielectric 124, for example.

Figure 1D:
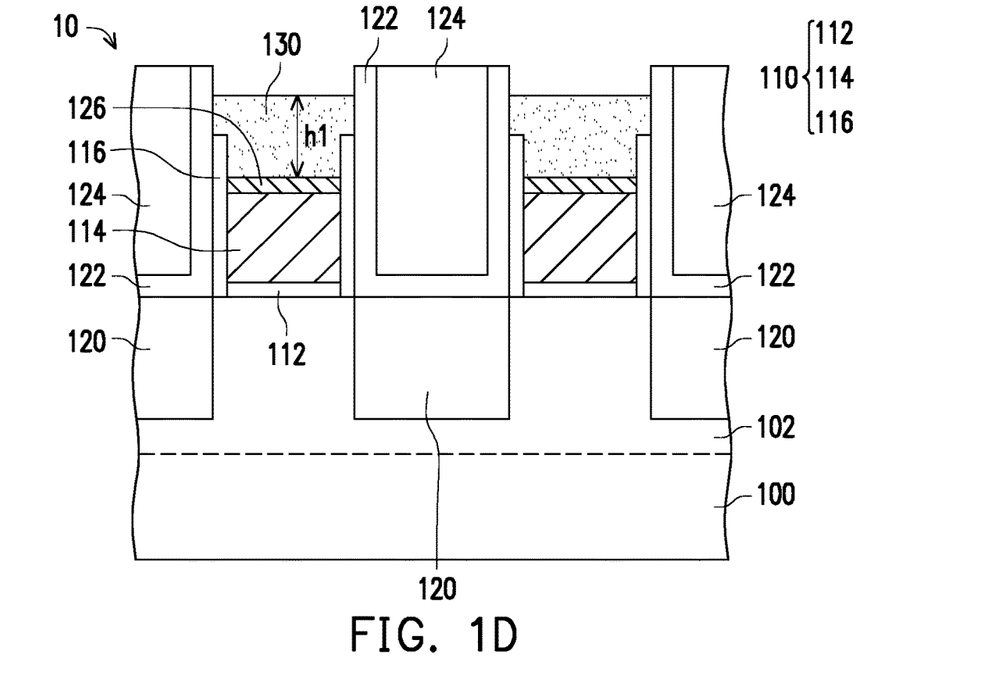

Referring to FIG. 1D, the material layer 130 is partially removed, so that a top surface of the material layer 130 is lower than the top surface of the CESL 122 while the material layer 130 covers the spacer 116 and the conductive layer 126 on the gate electrode 114. In other words, the top surface of the material layer 130 is disposed at a height between the top surfaces of the CESL 122 and the spacer 116. In some embodiments, a height h1 of the material layer 130 ranges from about 5 nm to about 15 nm. In some embodiments, the material layer 130 may be removed by a planarization process and an etch back process. The planarization process may include a chemical mechanical polishing (CMP) process, an etch process, or other suitable process. In some embodiments, the etch back process may include a dry etching process with using 0.1% $NF_3$ as reaction gas for etching Si, using 30% $NF_3$ as reaction gas for etching SiN, using $NF_3$ and $H_2$ as reaction gases for etching Si, using $NF_3$, $H_2$ and $O_2$ as reaction gases for etching SiN or using other suitable gases. In some alternative embodiments, the etching process may include a wet etching process. In some embodiments, since the material layer 130 has the different etch selectivity from the CESL 122 and the inter-layer dielectric 124, during the etch back process, the CESL 122 and the inter-layer dielectric 124 are not removed with respect to the removal of the material layer 130.

Figure 1E:
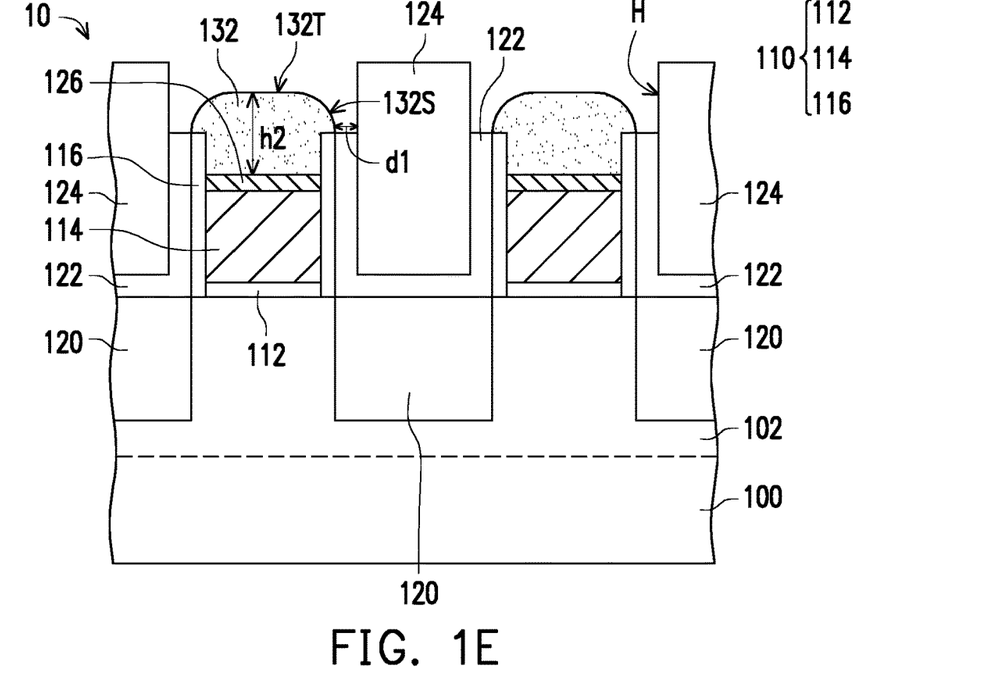

Referring to FIG. 1E, a portion of the CESL 122 is removed to form a hollow portion H, until the top surface of the CESL 122 is substantially flush with the top surface of the spacer 116. In some embodiments, after the removal process, the top surface of the CESL 122 is lower than the top surface of the inter-layer dielectric 124 and exposed by the material layer 130. In some embodiments, the removal process is also referred as a pull-back etching. In some embodiments, during the removal process, the material layer 130 is also partially removed to form a dummy hard mask layer 132 having a rounded top corner, for example. In some embodiments, the dummy hard mask layer 132 is disposed over the gate structure 110. In detail, the dummy hard mask layer 132 is formed on the conductive layer 126 and extended onto the spacer 116 beyond the gate electrode 114. Accordingly, the dummy hard mask layer 132 is mushroom-shaped, for example. The dummy hard mask layer 132 has a top surface 132T and a sidewall 132S, and the top corner is formed at which the top surface 132T and the sidewall 132S are connected. The top surface 132T is substantially flat, and is lower than the top surface of the inter-layer dielectric 124 and higher than the top surfaces of the spacer 116 and the CESL 122. In some embodiments, the top corner of the dummy hard mask layer 132 is rounded in the range of larger than 90 degrees and may be in the range from 90 to 135 degrees. In some embodiments, the dummy hard mask layer 132 covers the whole top surface of the corresponding spacer 116. However, the disclosure is not limited thereto. In some alternative embodiments, a portion of the spacer 116 may be exposed by the dummy hard mask layer 132. In some embodiments, a distance d1 between a sidewall of the inter-layer dielectric 124 and the sidewall 132S of the dummy hard mask layer 132 ranges about 1 nanometer to about 7 nm. In some embodiments, the distance d1 is about 1 nanometer to about 3 nm. In some embodiments, the distance d1 is substantially the same as the thickness of the CESL 122. In some embodiments, the dummy hard mask layer 132 has a height h2 less than a height of the gate electrode 114, and a height difference therebetween is 1 nm to 5 nm, for example. In some embodiments, the height h2 is in the range of about 5 nm to about 15 nm. In some alternative embodiments, the height h2 may be larger than 10, for example. In some embodiments, the height h2 of the dummy hard mask layer 132 is substantially equal to the height h1 of the material layer 130. However, the disclosure is not limited thereto; in some alternative embodiments, after the removal process, the height h2 of the dummy hard mask layer 132 may be less than the height h1 of the material layer 130.

In some embodiments, the hollow portion H is formed by partially removing the CESL 122 and the material layer 130, and the hollow portion H is disposed between the dummy hard mask layer 132 and the inter-layer dielectric 124. In some embodiments, the hollow portion H is inverted U-shaped, for example. In some embodiments, the hollow portions H exposes the top surface 132T and the sidewall 132S of the dummy hard mask layer 132 and the top surface of the CESL 122. In some embodiments, the CESL 122 and the material layer 130 may be removed by an etching process simultaneously or separately. In some embodiments, since the inter-layer dielectric 124 has the different etch selectivity from the CESL 122 and the material layer 130, during the etching process, the inter-layer dielectric 124 is not removed with respect to the removals of the CESL 122 and the material layer 130. In some embodiments, the etching process may include a dry etching process with using 0.1% $NF_3$ as reaction gas for etching Si, using 30% $NF_3$ as reaction gas for etching SiN, using $NF_3$ and $H_2$ as reaction gases for etching Si, using $NF_3$, $H_2$ and $O_2$ as reaction gases for etching SiN or using other suitable gases. In some alternative embodiments, the etching process may include a wet etching process.

Figure 1F:
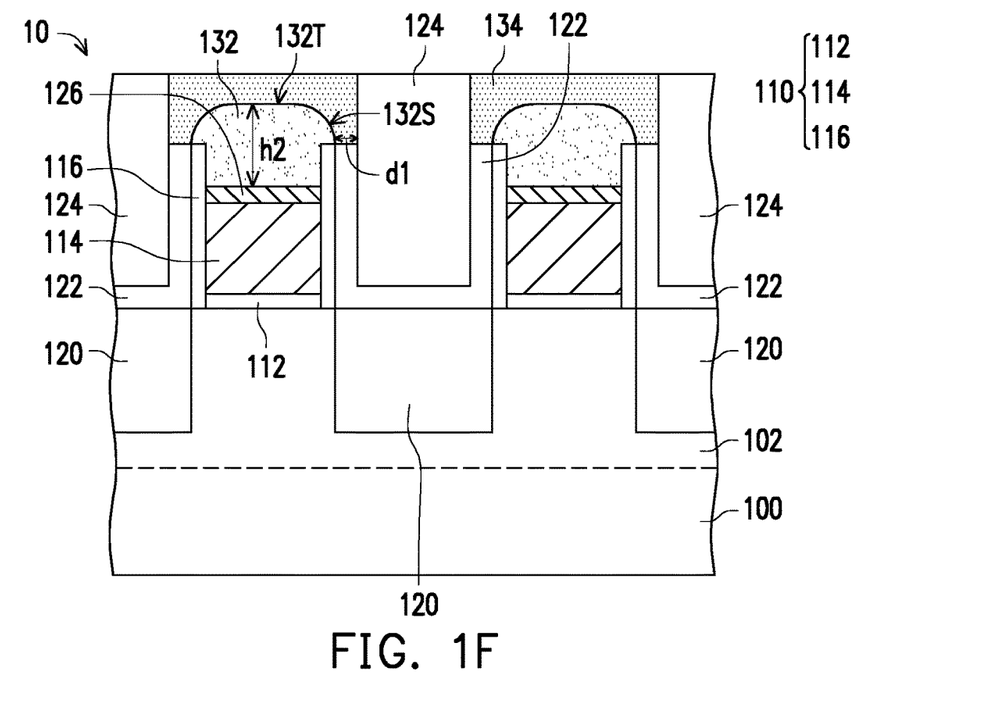

Referring to FIG. 1F, a dielectric pattern 134 is formed in the hollow portion H to cover the top surface 132T and the sidewall 132S of the dummy hard mask layer 132 and the top surface of the CESL 122. In some embodiments, the dielectric pattern 134 is filled into the hollow portion H, and has a top surface substantially flush with or coplanar with the top surface of the inter-layer dielectric 124. In some embodiments, the material of the dielectric pattern 134 is different from the material of the dummy hard mask layer 132. In some embodiments, the dielectric pattern 134 has a different etch selectivity from the inter-layer dielectric 124 and the dummy hard mask layer 132. In some embodiments, the material of the dielectric pattern 134 includes high k dielectrics with a k constant larger than 10 such as metal oxides, metal nitrides, metal silicates or other suitable high k dielectrics. In some embodiments, the high k dielectrics include $ZrO_2$, $HfO_2$, HfSiO, ZrSiO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, a combination thereof or other suitable material. In some embodiments, the material of the dielectric pattern 134 may be $ZrO_2$. In some embodiments, the method of forming the dielectric pattern 134 may include a deposition process and then a planarization process. The deposition process may include atomic layer deposition (ALD), molecular beam deposition (MBD), chemical vapor deposition (CVD), physical vapor deposition (PVD), or a combination thereof. The planarization process may be performed by using the top surface of the inter-layer dielectric 124 as a stop layer and may include a chemical mechanical polishing (CMP) process, an etch process, or other suitable process.

Figure 1G:
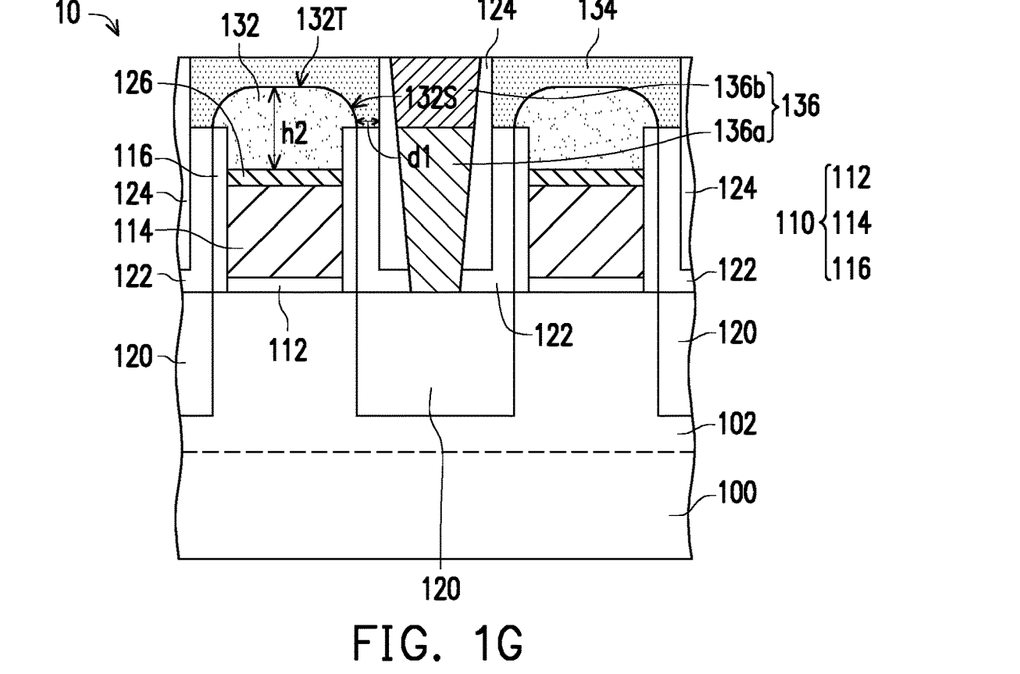

Referring to FIG. 1G, a conductive structure 136 is formed over and electrically connected to the source-drain region 120. In some embodiments, the conductive structure 136 is formed in the inter-layer dielectric 124, and the conductive structure 136 has a top surface substantially flush with or coplanar with the top surfaces of the inter-layer dielectric 124 and the dielectric pattern 134. In some embodiments, an opening is formed in the inter-layer dielectric 124 and the CESL 122 to expose a portion of the source-drain region 120, and then the conductive structure 136 is filled in the opening to electrically connect to the source-drain region 120. In some alternative embodiments, the opening may be formed in the CESL 122 by removing the inter-layer dielectric 124 between the CESL 122, and thus the conductive structure 136 is in contact with the CESL 122 without the inter-layer dielectric 124 therebetween. In some embodiments, the opening is formed by an etching process, such as dry etching process, wet etching process or a combination thereof, and the conductive structure 136 may be formed by a sputtering process, a deposition process, such as atomic layer deposition (ALD), molecular beam deposition (MBD), chemical vapor deposition (CVD), physical vapor deposition (PVD) or a combination thereof, or any other suitable process. In some alternative embodiments, the conductive structure 136 may be formed by a deposition process and then a planarization process, in this case, top portions of the inter-layer dielectric 124 and the dielectric pattern 134 may be not removed or partially removed. In some embodiments, the material of the conductive structure 136 may include a metal, such as copper, titanium, tungsten, cobalt, aluminum, any other suitable metal or a combination thereof. Accordingly, the conductive structure 136 is also referred to as "MD (metal drain)" contact. In some embodiments, the conductive structure 136 may be multiple-layer structure and include conductive layers 136a, 136b, and the conductive layer 136b is disposed on the conductive layer 136a and includes a material having resistance lower than the material of the conductive layer 136a. For example, the material of the conductive layer 136a includes cobalt, and the material of the conductive layer 136b includes tungsten. In some alternative embodiments, the conductive structure 136 is single-layer. Moreover, the conductive structure 136 may further include barrier layer.

Figure 1H:
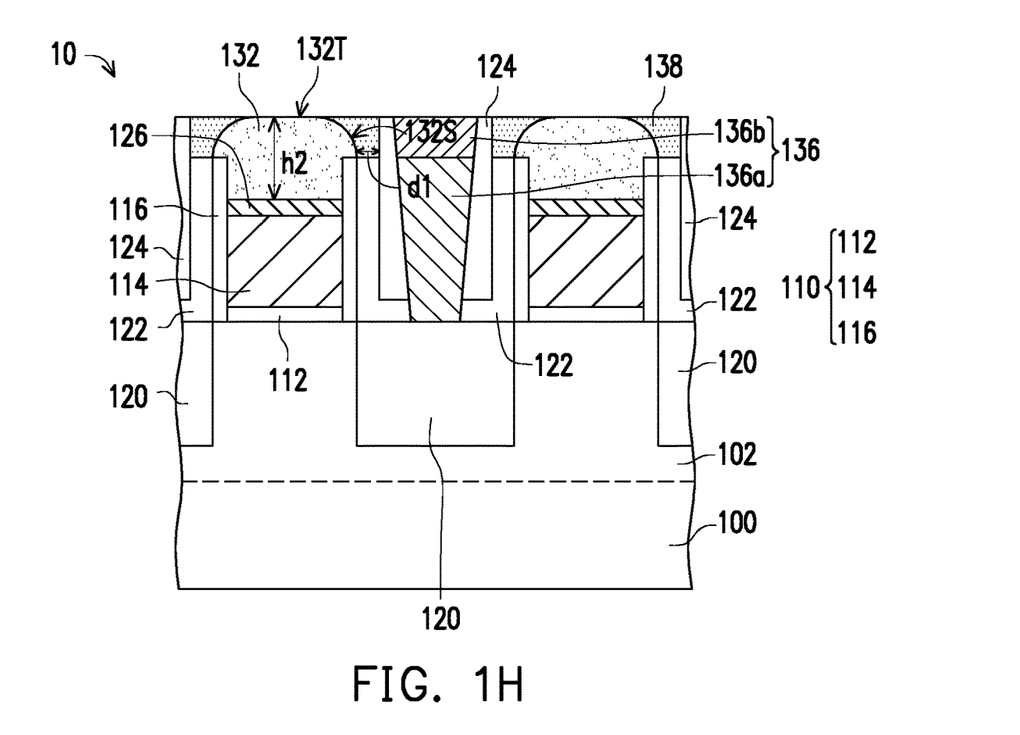

Referring to FIG. 1H, a portion of the dielectric pattern 134 is removed to form a hard mask layer 138 and exposes the top surface 132T of the dummy hard mask layer 132. In some embodiments, the hard mask layer 138 is disposed on the CESL 122, and the hard mask layer 138 surrounds and exposes the top surface 132T of the dummy hard mask layer 132. The dielectric pattern 134 is partially removed by a planarization process by using the top surface 132T of the dummy hard mask layer 132 as a stop layer, and the planarization process may include a chemical mechanical polishing (CMP) process, an etch process, or other suitable process. In some embodiments, during the removal process, portions of the inter-layer dielectric 124 and the conductive structure 136 are also removed. In some embodiments, portions of the inter-layer dielectric 124 and the conductive layer 136b are removed while the conductive layer 136a remains intact since protected by the conductive layer 136b. After the removal process, the top surface of the hard mask layer 138 is substantially flush with or coplanar with the top surface 132T of the dummy hard mask layer 132 and the top surfaces of the inter-layer dielectric 124 and the conductive structure 136. In some embodiments, the dummy hard mask layer 132 is not removed during the removal process, but the disclosure is not limited thereto. In some alternative embodiments, the top portion of the dummy hard mask layer 132 may be partially removed during the removal process, and thus the height of the dummy hard mask layer 132 may be reduced. In addition, after the removal process, a flatness of the top surface 132T of the dummy hard mask layer 132 may be increased.

Figure 1I:
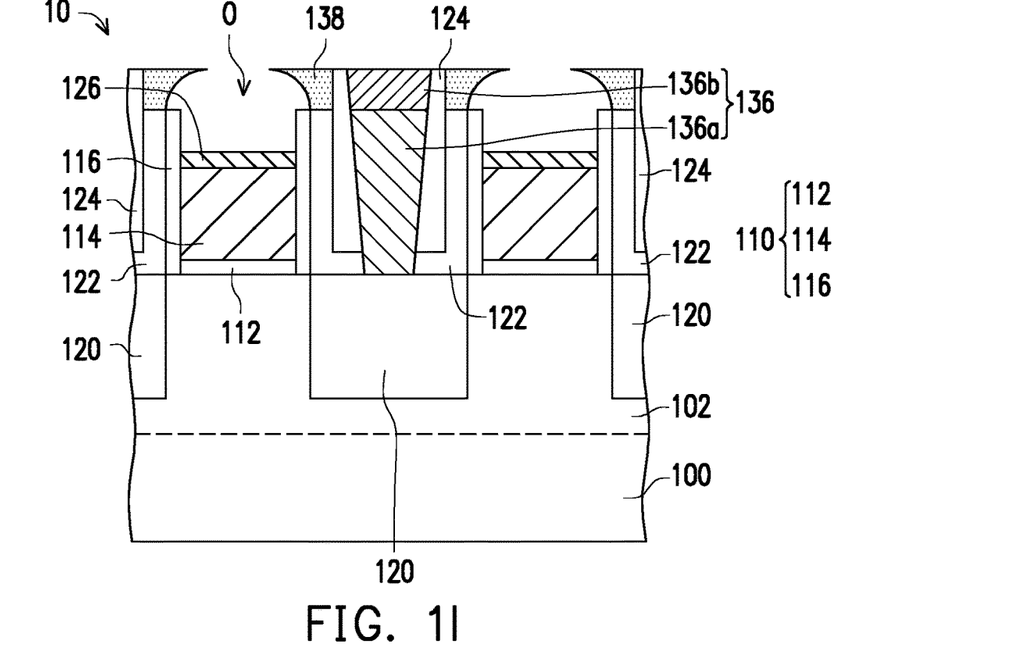
Figure 1J:
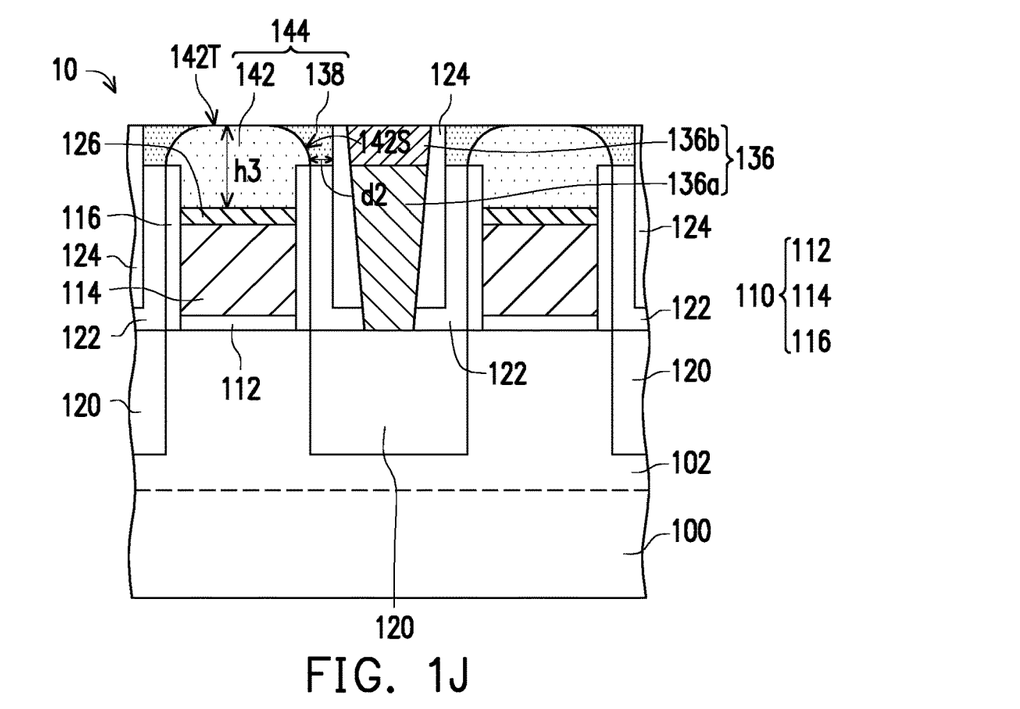

Referring to FIGS. 1I and 1J, the dummy hard mask layer 132 is replaced by a hard mask layer 142. In some embodiments, as shown in FIG. 1I, the dummy hard mask layer 132 is removed to form an opening O exposing the conductive layer 126 and the spacer 116 on the gate electrode 114. In some embodiments, the dummy hard mask layer 132 is entirely removed by an etching process. In some embodiments, the etching process may include a dry etching process with using $NF_3$ as reaction gas. In some alternative embodiments, the etching process may include a wet etching process with ozonated deionized water ($DIO_3$) to remove the by-product. In some embodiments, since the dummy hard mask layer 132 has the different etch selectivity from the hard mask layer 138 and the spacer 116, during the etching process, the hard mask layer 138 and the spacer 116 are not removed with respect to the removal of the dummy hard mask layer 132.

Then, as shown in FIG. 1J, the hard mask layer 142 is formed in the opening O to cover the conductive layer 126 and the spacer 116 on the gate electrode 114. In some embodiments, the hard mask layer 142 is filled into the opening O to seal up the opening O. In some embodiments, since the hard mask layer 142 is formed by replacing the dummy hard mask layer 132, the profile of the hard mask layer 142 including a top surface 142T, a sidewall 142S and a rounded top corner, a height h3 of the hard mask layer 142 and a distance d2 between the hard mask layer 142 and the inter-layer dielectric 124 are substantially the same as or similar to the profile of the dummy hard mask layer 132 including the top surface 132T, the sidewall 132S and the rounded top corner, the height h3 of the dummy hard mask layer 132 and the distance d1 between the dummy hard mask layer 132 and the inter-layer dielectric 124 described in FIG. 1E and thus omitted herein. In some embodiments, the hard mask layer 142 and the hard mask layer 138 together constitute a hard mask structure 144. In some embodiments, the hard mask structure 144 is disposed over the gate structure 110 and the CESL 122. In some embodiments, the top surface of the hard mask structure 144 is substantially flush with or coplanar with the top surface of the inter-layer dielectric 124, wherein the top surface of the hard mask structure 144 is the top surfaces of the corresponding hard mask layers 138, 142. In some embodiments, the material of the hard mask layer 142 is different from the material of the hard mask layer 138. In some embodiments, a k constant of the material of the hard mask layer 142 is lower than a k constant of the material of the hard mask layer 138. In some embodiments, the hard mask layer 142 has a different etch selectivity from the hard mask layer 138 and the inter-layer dielectric 124. In some embodiments, the material of the hard mask layer 142 includes low-k dielectrics with a k constant less than 5 such as SiOC, SiCN, SiN, $SiO_2$, a combination thereof or other suitable low-k dielectrics. In some embodiments, the material of the hard mask layer 142 may be SiOC. In some embodiments, the hard mask layer 142 is made of a single material, but the disclosure is not limited thereto. In some alternative embodiments, the hard mask layer 142 may include multiple materials, in other words, the opening O may be sealed up by at least two materials. For example, the opening O is partially filled with a first material, and then is partially filled with a second material which is different from the first material. In some embodiments, the method of forming the hard mask layer 142 may include a deposition process and then a planarization process. The deposition process may include atomic layer deposition (ALD), molecular beam deposition (MBD), chemical vapor deposition (CVD), physical vapor deposition (PVD), or a combination thereof. The planarization process may be performed by using the top surface of the inter-layer dielectric 124 as a stop layer and may include a chemical mechanical polishing (CMP) process, an etch process, or other suitable process.

Figure 1K:
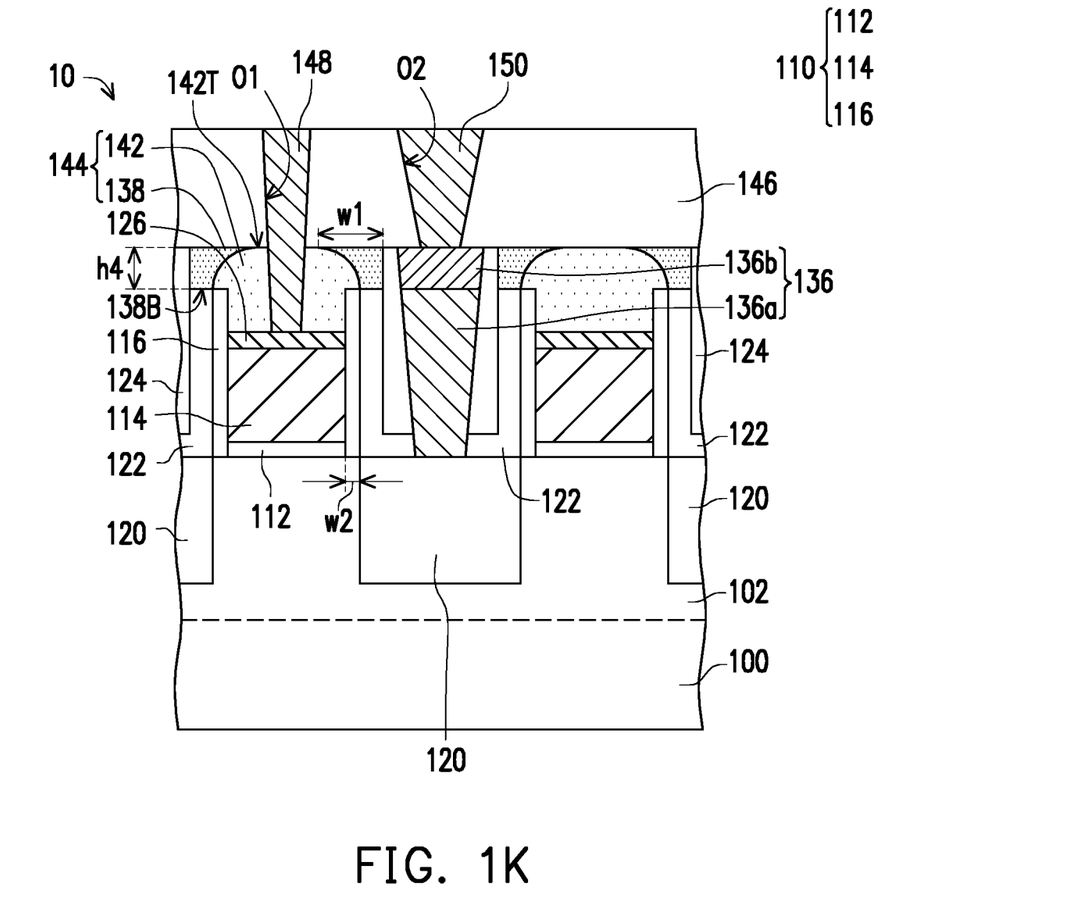

Referring to FIG. 1K, a dielectric layer 146 is formed on the hard mask structure 144 and the conductive structure 136. In some embodiments, the material of the dielectric layer 146 may be $SiO_2$, SiN, SiON, SiCN, or any other suitable material. In some embodiments, the dielectric layer 146 is formed by using a suitable process such as atomic layer deposition (ALD), molecular beam deposition (MBD), chemical vapor deposition (CVD), physical vapor deposition (PVD), or a combination thereof. In some embodiments, the dielectric layer 146 is single-layer structure. In some alternative embodiments, the dielectric layer 146 is multi-layer structure.

Then, an opening O1 is formed in the dielectric layer 146 and the hard mask layer 142, an opening O2 is formed in the dielectric layer 146, and a plug 148 and a plug 150 respectively are formed in the opening O1 and the opening O2 and respectively are electrically connected to the gate structure 110 and the conductive structure 136. That is, the opening O1 is configured for the plug 148 to be formed and electrically connected to the gate structure 110, and the opening O2 is configured for the plug 150 to be formed and electrically connected to the conductive structure 136. In some embodiments, the plug 148 is surrounded by the hard mask structure 144. In some embodiments, as shown in FIG. 1K, one opening O1 and one opening O2 are shown for illustration purpose, but the disclosure is not limited thereto. In some alternative embodiments, the number of the opening O1 and the number of the opening O2 may respectively be more than one.

In some embodiments, the openings O1, O2 may be formed by photolithography and etching processes. In some embodiments, the openings O1, O2 may be formed in different steps. However, in some alternative embodiments, the opening O1 and the opening O2 may be formed in the same step. In some embodiments, since the hard mask layer 138 of the hard mask structure 144 has the different etch selectivity from the dielectric layer 146, during the etching process of the opening O1 for the plug 148, the hard mask layer 138 remains intact while the hard mask layer 142 is partially removed during the etching process. Thus, the hard mask layer 138 is used as a self-aligned mask, and the etching process for forming the opening O1 is referred to as a self-aligned etching process. Accordingly, due to the self-aligned formed opening O1, the plug 148 formed in the opening O1 is self-aligned formed, and the process window of the plug 148 can be enlarged. In some embodiments, due to the above self-aligned process, the plug 148 is also referred to as a self-aligned contact.

In some embodiments, the method of forming the plugs 148, 150 may include: a deposition process and then a planarization process, a sputtering process and then a planarization process, or an electro-chemical plating process and then a planarization process. The deposition process may include atomic layer deposition (ALD), molecular beam deposition (MBD), chemical vapor deposition (CVD), physical vapor deposition (PVD), or a combination thereof. The planarization process may include a chemical mechanical polishing (CMP) process, an etch process, or other suitable process. In some embodiments, the materials of the plug 148 and the plug 150 may respectively be conductive material, such as cobalt, tungsten, copper, titanium, tantalum, aluminum, zirconium, hafnium, or other suitable material. In some embodiments, the plug 148 contacts the conductive layer 126. That is, the plug 148 is electrically connected to the gate structure 110 through the conductive layer 126. In some embodiments, the plug 148 contacts the hard mask layer 142. In some embodiments, the plug 148 is also referred as a via gate (VG), and the plug 150 is also referred as a via drain (VD), for example.

In some embodiments, the dummy hard mask layer 132 may be replaced after forming the conductive structure 136. However, in some alternative embodiments, the conductive structure 136 may be formed after forming the hard mask structure 144 and before forming the dielectric layer 146, that is, the hard mask structure 144 may be formed before forming the dielectric layer 146.

In some embodiments, the hard mask structure 144 is disposed over the gate electrode 114 and has a width wider than the gate electrode 114 therebeneath. The isolating structure including the spacer 116 and the CESL 122 are disposed under the hard mask structure 144. In some embodiments, the hard mask structure 144 includes at least two materials, which are a low-k material of the hard mask layer 142 and a high-k material of the hard mask layer 138. The hard mask layer 142 surrounds and is in contact with the plug 148, and the hard mask layer 138 surrounds and is in contact with the hard mask layer 142. The top surface of the hard mask layer 138 is substantially flush with or coplanar with the top surface of the hard mask layer 142, that is, at least a portion of the hard mask layer 142 is not covered by the hard mask layer 138, and thus the hard mask layer 138 is not in contact with the plug 148. In some embodiments, the hard mask layer 138 has an opening exposing the hard mask layer 142 and a thickness of the hard mask layer 138 is gradually reduced from the outer to the inner. In some embodiments, the hard mask layer 138 is shaped as a hollow ring, for example. The hard mask layer 138 covers the top surface of the CESL 122, and the hard mask layer 142 covers the top surfaces of the conductive layer 126 on the gate electrode 114 and the spacer 116. In some embodiments, the hard mask layer 142 is partially disposed between the CESL 122 and the plug 148 and partially protrudes from the CESL 122, and in detail, the hard mask layer 142 is partially disposed between the spacer 116 and the plug 148 and partially protrudes from the spacer 116 and extends onto the top surface of the spacer 116. The hard mask layer 138 covers a portion of the sidewall of the hard mask layer 142 and exposes the top surface of the hard mask layer 142. In some embodiments, the bottom surface 138B of the hard mask layer 138 is disposed at a height between the top surface and the bottom surface of the hard mask layer 142. In some embodiments, an interface between the hard mask layer 138 and the hard mask layer 142 is curved. In other words, the sidewall of the hard mask layer 142 includes a curved portion being in contact with the hard mask layer 138 and a straight portion being in contact with the spacer 116. In some embodiments, an outer sidewall of the hard mask structure 144 (i.e., an outer sidewall of the hard mask layer 138) is flush with an outer sidewall of the CESL 122, and an inner sidewall of the hard mask structure 144 (i.e., the straight portion of the sidewall of the hard mask layer 142) is flush with the sidewall of the gate structure 110. In some embodiments, for good isolation, a width w1 of the hard mask layer 138 is wider than a width w2 of the spacer 116 by at least 2 nm such as 2 to 4 nm. In some embodiments, a height h4 of the hard mask layer 138 is larger than 5 nm, for example. In some embodiments, the hard mask structure 144 is T-shaped, for example. In some embodiments, the hard mask layer 138 is not in contact with the plug 148, but the disclosure is not limited thereto. In some alternative embodiments, the hard mask layer 138 may be in contact with the plug 148 at a contact point formed among a sidewall of the plug 148, the hard mask layer 138 and the hard mask layer 142, and the contact point is at the inner edge of the hard mask layer 138.

In some embodiments, the hard mask structure 144 is disposed between and insulates the conductive structure 136 and the gate structure 110 aside the conductive structure 136, and thereby an isolation therebetween is improved. Similarly, the hard mask structure 144 is disposed between and insulates the plug 148 and the conductive structure 136 adjacent to the plug 148, and thereby an isolation therebetween is improved. Accordingly, the risk of a short-circuit bridge between the conductive structure 136 and the gate structure 110 and between the plug 148 and the conductive structure 136 is reduced. Moreover, since the hard mask structure 144 includes at least two materials with different k constant, the k constant of the hard mask structure 144 may be adjusted in accordance with the requirements. In some embodiments, the semiconductor device 10 may have the reduced capacitance, thereby enhancing the electric performance of the semiconductor device 10.

Figure 2A:
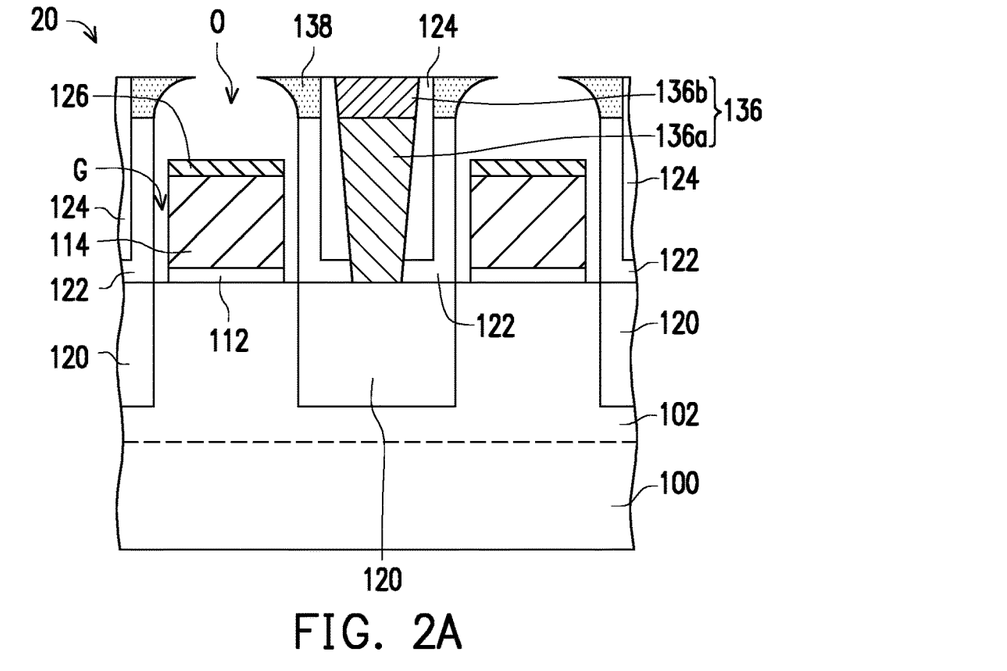
FIGS. 2A to 2C are cross-sectional views at various stages of forming a semiconductor device in accordance with some embodiments of the present disclosure.
Figure 2B:
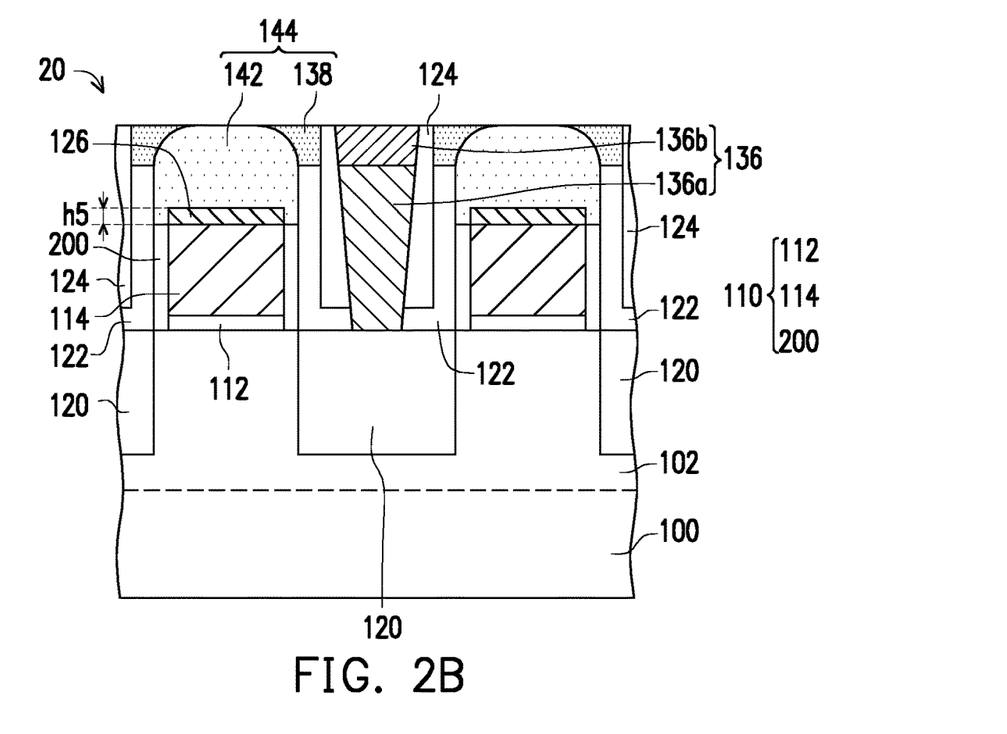
Figure 2C:
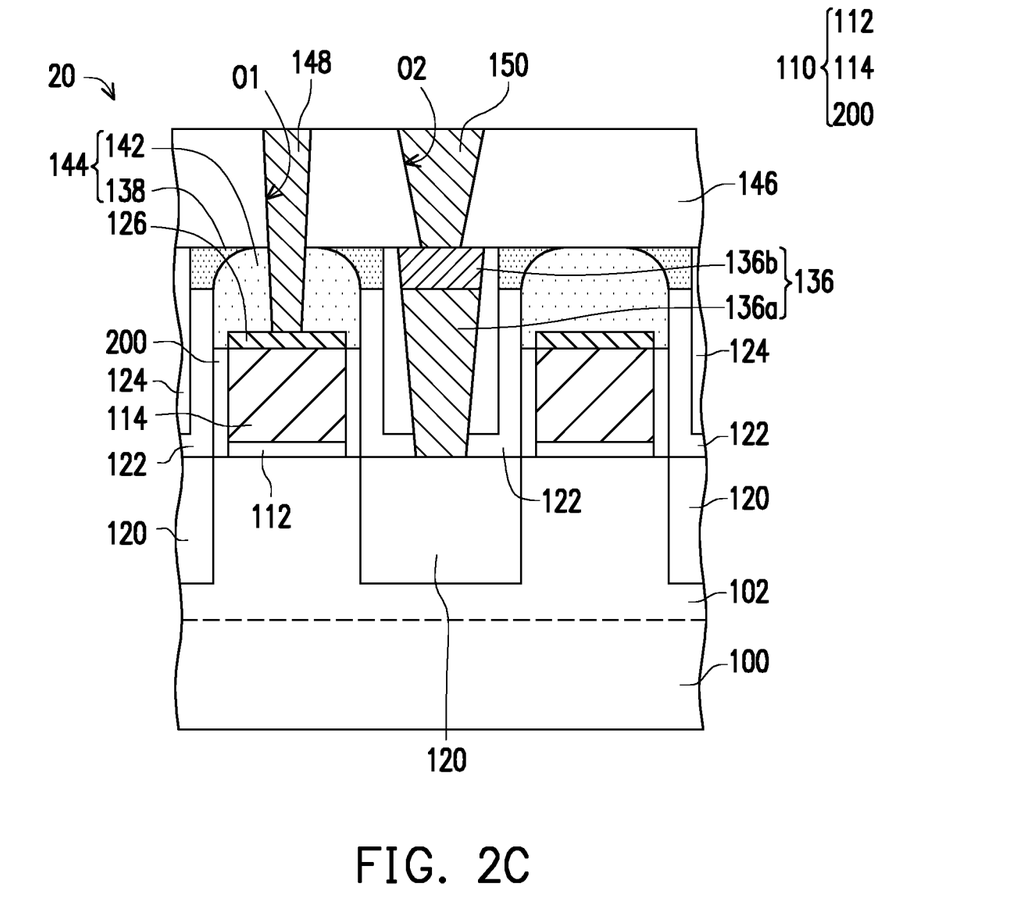

FIG. 2A to FIG. 2C are cross-sectional views at various stages of forming a semiconductor device 20 in accordance with some embodiments of the present disclosure. The steps of FIG. 2A to FIG. 2C follow the procedures of FIG. 1A to FIG. 1I, in other words, the step of FIG. 2A is continuously performed after the step of FIG. 1I. The elements similar to or substantially the same as the elements described previously will use the same reference numbers, and certain details or descriptions (e.g. the relative configurations or electrical connections, and the formations and materials) of the same elements may not be repeated herein.

Referring to FIG. 2A, a structure same as the structure of FIG. 1I is provided, and then the spacer 116 is removed, so as to form an air gap G aside the gate electrode 114 and the gate dielectric layer 112. In some embodiments, the air gap G exposes the sidewalls of the gate dielectric layer 112 and the gate electrode 114. In some embodiments, the spacer 116 is removed by an etching process such as a dry etching process or a wet etching process. In some embodiments, during the removal process, the hard mask layer 138, the CESL 122 and the inter-layer dielectric 124 are not removed with respect to the removal of the spacer 116 due to the specific etching selectivity chosen based on the material differences.

Referring to FIG. 2B, a hard mask layer 142 is formed in the opening O and the air gap G to cover the conductive layer 126 and form an air spacer 200. In some embodiments, the hard mask layer 142 and the hard mask layer 138 together constitute a hard mask structure 144. In some embodiments, the hard mask layer 142 is entirely filled into the opening O and partially filled into the air gap G to seal up the opening O and the air gap G. That is, some of the air gap G is not filled with the hard mask layer 142 to form the air spacer 200 aside the gate dielectric layer 112 and the gate electrode 114. In other words, the spacer 116 of FIGS. 1A to 1I is replaced by the air spacer 200. In some embodiments, depending on the conditions such as molecular weight and adhesion of the material of the hard mask layer 142 and the forming method of the hard mask layer 142, an interface between the hard mask layer 142 and the air spacer 200 may be substantially equal to or lower than the top surface of the conductive layer 126 or substantially lower than the top surface of the gate electrode 114. In some embodiments, the hard mask layer 142 is formed on the conductive layer 126 and extended into the air gap G, and thus covers a portion of a sidewall of the conductive layer 126, for example. In some embodiments, a height h5 of the hard mask layer 142 below the top surface of the conductive layer 126 ranges from about 1 nm to about 5 nm, for example. In some alternative embodiments, the hard mask layer 142 further covers a portion of a sidewall of the gate electrode 114, for example. In some embodiments, the air spacer 200 has a thickness t2 in the range of about 1 nm to about 5 nm, such as about 2 nm to about 3 nm. In some embodiments, the spacer 116 is entirely removed, but the disclosure is not limited thereto. In some alternative embodiments, according to the requirements, the spacer 116 may be partially removed, in other words, only a portion of the spacer 116 is replaced by the air spacer 200. Therefore, in some alternative embodiments, the spacer 116 and the air spacer 200 may be simultaneously disposed aside the same gate electrode 114, and the air spacer 200 is disposed on the spacer 116.

Referring to FIG. 2C, a dielectric layer 146 is formed on the hard mask structure 144 and the conductive structure 136, and a plug 148 and a plug 150 respectively are formed in the dielectric layer 146 to electrically connected to the gate structure 110 and the conductive structure 136.

In some embodiments, since the hard mask structure 144 has a high-k hard mask layer 138 and a low-k hard mask layer 142, the k constant of the hard mask structure 144 may be easily adjusted in accordance with the requirements. In addition, the semiconductor device 20 further includes the air spacer 200 having a k constant equal to about 1, and thus the has semiconductor device 20 has the reduced capacitance, thereby enhancing the electric performance of the semiconductor device 20.

In accordance with some embodiments of the disclosure, a semiconductor device includes a substrate, a gate structure, a plug and a hard mask structure. The gate structure is disposed over the substrate. The plug is disposed over and electrically connected to the gate structure. The hard mask structure is disposed over the gate structure and includes a first hard mask layer and a second hard mask layer. The first hard mask layer surrounds and is in contact with the plug. The second hard mask layer surrounds the first hard mask layer and has a bottom surface at a height between a top surface and a bottom surface of the first hard mask layer. A material of the first hard mask layer is different from a material of the second hard mask layer.

In accordance with alternative embodiments of the disclosure, a semiconductor device includes a substrate, a gate structure, a plug, a CESL and a hard mask structure. The gate structure is disposed over the substrate. The plug is disposed over and electrically connected to the gate structure. The CESL is disposed aside the gate structure. The hard mask structure is disposed over the gate structure and includes a first hard mask layer and a second hard mask layer. The first hard mask layer is partially disposed between the CESL and the plug and partially protrudes from the CESL. The second hard mask layer is disposed aside the first mask layer on the CESL. A material of the first hard mask layer is different from a material of the second hard mask layer.

In accordance with yet alternative embodiments of the disclosure, a method of forming a semiconductor device includes following steps. A gate structure is formed over a substrate, wherein the gate structure comprises a gate electrode and a spacer aside the gate electrode. A CESL is formed aside the gate structure, wherein the spacer is disposed between the CESL and the gate electrode. A hard mask structure is formed over the gate structure, wherein the hard mask structure a first hard mask layer and a second hard mask layer, the first hard mask layer partially protrudes from the CESL, the second hard mask layer is disposed aside the first mask layer on the CESL, and a material of the first hard mask layer is different from a material of the second hard mask layer. A plug is formed over the gate structure, wherein the hard mask structure surrounds the plug.

In accordance with some embodiments of the disclosure, a semiconductor device includes a gate electrode, spacers and a hard mask structure. The spacers are disposed on opposite sidewalls of the gate electrode. The hard mask structure includes a first hard mask layer and a second hard mask layer. A lower portion of the first hard mask layer is disposed between the spacers and on the gate electrode, and a top portion of the first hard mask layer is surrounded by the second hard mask layer.

In accordance with some embodiments of the disclosure, a semiconductor device includes a gate electrode, air spacers on opposite sidewalls of the gate electrode and a hard mask structure. The air spacers are disposed on opposite sidewalls of the gate electrode. The hard mask structure includes a first hard mask layer and a second hard mask layer not integrally formed with the first hard mask layer. The first hard mask covers the gate electrode and the air spacers, and the second hard mask layer surrounds the first hard mask.

In accordance with some embodiments of the disclosure, a method of forming a semiconductor device includes the following steps. A gate electrode and spacers on sidewalls of the gate electrode are formed. A sacrificial pattern is formed to cover the gate electrode and the spacers. A dielectric pattern is formed to cover and surround a top portion of the sacrificial pattern. A portion of the dielectric pattern is formed to expose a top surface of the sacrificial pattern. The sacrificial pattern is replaced with a first hard mask, wherein the remaining dielectric pattern forms a second mask layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a gate electrode;
   spacers on opposite sidewalls of the gate electrode; and
   a hard mask structure, comprising a first hard mask layer and a second hard mask layer, wherein a first portion of the first hard mask layer is disposed between the spacers and on the gate electrode, a second portion of the first hard mask layer is surrounded by the second hard mask layer, and the second hard mask layer is extended over the spacers and beyond outer sidewalls of the spacers.

2. The semiconductor device as claimed in claim 1, wherein a surface of the gate electrode is lower than surfaces of the spacers.

3. The semiconductor device as claimed in claim 1, wherein sidewalls of the first portion of the first hard mask layer is substantially flush with the sidewalls of the gate electrode.

4. The semiconductor device as claimed in claim 1, wherein the second hard mask layer is not integrally formed with the first hard mask layer.

5. The semiconductor device as claimed in claim 1, wherein an interface of the first hard mask layer and the second hard mask layer is curved.

6. The semiconductor device as claimed in claim 1 further comprising a plug penetrating through the first hard mask layer to electrically connect the gate electrode.

7. A semiconductor device, comprising:
   a gate electrode;
   spacers on opposite sidewalls of the gate electrode; and
   a hard mask structure, comprising a first hard mask layer and a second hard mask layer not integrally formed with the first hard mask layer, wherein the first hard mask layer covers the gate electrode and the spacers, the second hard mask layer surrounds the first hard mask layer, and an interface between the first hard mask layer and the second hard mask layer is curved toward a surface of the gate electrode.

8. The semiconductor device as claimed in claim 7, wherein a k constant of a material of the first hard mask layer is lower than a k constant of a material of the second hard mask layer.

9. The semiconductor device as claimed in claim 7 further comprising a contact etch stop layer (CESL) aside the gate electrode, wherein an outer sidewall of the second hard mask layer is flush with an outer sidewall of the CESL.

10. The semiconductor device as claimed in claim 9, wherein a surface of the spacer is lower than a surface of the CESL.

11. The semiconductor device as claimed in claim 7, wherein a surface of the first hard mask layer is substantially flush with a surface of the second hard mask layer.

12. The semiconductor device as claimed in claim 7 further comprising a conductive layer between the gate electrode and the first hard mask layer.

13. A method of forming a semiconductor device, comprising:

forming a gate electrode and spacers on sidewalls of the gate electrode;

forming a sacrificial pattern to cover the gate electrode and the spacers;

forming a dielectric pattern to cover and surround a top portion of the sacrificial pattern;

removing a portion of the dielectric pattern to expose a top surface of the sacrificial pattern; and replacing the sacrificial pattern with a first hard mask layer, wherein the dielectric pattern forms a second mask layer after removing the portion of the dielectric pattern.

14. The method as claimed in claim 13, wherein the step of replacing the sacrificial pattern with the first hard mask layer comprises:

removing the sacrificial pattern to form an opening; and
filling the opening with the first mask layer.

15. The method as claimed in claim 13, wherein top surfaces of the spacers are higher than a top surface of the gate electrode.

16. The method as claimed in claim 13 further comprising forming a contact etch stop layer (CESL) aside the gate electrode and the spacers, wherein the first hard mask layer partially protrudes from the CESL.

17. The method as claimed in claim 16, wherein a method of forming the sacrificial pattern comprises:

forming a dielectric material over the spacer and the CESL having a top surface higher than a top surface of the spacer; and removing portions of the dielectric material and the CESL to form the sacrificial pattern, wherein the sacrificial pattern is disposed on the spacer and exposes the CESL having the top surface substantially flush with the top surface of the spacer.

18. The method as claimed in claim 13, wherein an interface between the first hard mask layer and the second hard mask layer is curved.

19. The semiconductor device as claimed in claim 1 further comprising a contact etch stop layer (CESL) on the outer sidewalls of the spacers, wherein a surface of the spacers is substantially coplanar with a surface of the CESL.

20. The semiconductor device as claimed in claim 7, wherein the second hard mask layer covers the first hard mask layer.

* * * * *